US009525386B2

United States Patent
Ide et al.

(10) Patent No.: US 9,525,386 B2
(45) Date of Patent: Dec. 20, 2016

(54) RECEIVER CIRCUIT

(71) Applicant: FUJITSU LIMITED, Kawasaki-shi, Kanagawa (JP)

(72) Inventors: Satoshi Ide, Yokohama (JP); Hideki Oku, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 128 days.

(21) Appl. No.: 14/666,836

(22) Filed: Mar. 24, 2015

(65) Prior Publication Data

US 2015/0311871 A1 Oct. 29, 2015

(30) Foreign Application Priority Data

Apr. 28, 2014 (JP) .................................. 2014-092755

(51) Int. Cl.
| | |
|---|---|
| *H03F 1/08* | (2006.01) |
| *H04B 10/60* | (2013.01) |
| *H03F 1/32* | (2006.01) |
| *H03F 3/08* | (2006.01) |
| *H03F 3/45* | (2006.01) |

(52) U.S. Cl.
CPC ............. *H03F 1/3211* (2013.01); *H03F 3/087* (2013.01); *H03F 3/45475* (2013.01); *H04B 10/60* (2013.01); *H03F 2200/129* (2013.01); *H03F 2203/45114* (2013.01); *H03F 2203/45116* (2013.01)

(58) Field of Classification Search
CPC ........ H03F 1/08; H03F 1/30; H03F 2200/129; H03F 3/45748; H03F 3/45959; H03F 3/45973; H03F 3/68; H04B 10/695; H04B 10/60; H04B 10/69; H04B 10/6911; H04B 10/6933

USPC .......................................... 398/202, 208–211
See application file for complete search history.

(56) References Cited

U.S. PATENT DOCUMENTS

| | | | | |
|---|---|---|---|---|
| 5,612,810 A | * | 3/1997 | Inami ................... | H04B 10/695 250/214 A |
| 6,342,694 B1 | * | 1/2002 | Satoh ................. | H04B 10/6911 250/214 A |
| 6,826,372 B1 | * | 11/2004 | Givehchi .............. | H04L 25/063 398/209 |

(Continued)

FOREIGN PATENT DOCUMENTS

| | | |
|---|---|---|
| JP | 2011-109721 | 6/2011 |
| JP | 2012-010187 | 1/2012 |

*Primary Examiner* — David Payne
*Assistant Examiner* — Tanya Motsinger
(74) *Attorney, Agent, or Firm* — Fujitsu Patent Center (57) ABSTRACT

A receiver circuit includes a first amplifier circuit to differentially amplify differential input signals by a linear operation, a second amplifier circuit configured to differentially amplify output differential signals of the first amplifier circuit by a limiting operation, a feedback circuit, first and second resistors coupled between the feedback circuit and outputs of the first amplifier circuit, and third and fourth resistors coupled between the feedback circuit and outputs of the second amplifier circuit. The feedback circuit amplifies a positive-phase signal that is output from a positive-phase output node thereof coupled to the first and third resistors, and a negative-phase signal that is output from a negative-phase output node thereof coupled to the second and fourth resistors, and feeds back a feedback signal after amplification to the first amplifier circuit.

14 Claims, 8 Drawing Sheets

(56) References Cited

U.S. PATENT DOCUMENTS

| | | | |
|---|---|---|---|
| 7,265,624 B2* | 9/2007 | Daio | H03F 1/34 |
| | | | 330/104 |
| 7,305,190 B2* | 12/2007 | Mayampurath | H03F 3/087 |
| | | | 398/202 |
| 7,382,987 B2* | 6/2008 | Misaizu | H03F 3/087 |
| | | | 398/202 |
| 7,787,780 B2* | 8/2010 | Suzunaga | H03F 3/08 |
| | | | 250/214 A |
| 9,030,263 B2 | 5/2015 | Robinson | H03G 3/3063 |
| | | | 330/308 |
| 2004/0036536 A1* | 2/2004 | Gupta | H03F 3/082 |
| | | | 330/308 |
| 2004/0081472 A1* | 4/2004 | Bardsley | H04B 10/077 |
| | | | 398/202 |
| 2006/0067713 A1* | 3/2006 | Farooqui | H03F 1/08 |
| | | | 398/209 |
| 2008/0197928 A1* | 8/2008 | Watson | H03F 3/45475 |
| | | | 330/260 |
| 2011/0318015 A1 | 12/2011 | Sugimoto | |
| 2015/0084688 A1* | 3/2015 | Chang | H03H 11/0466 |
| | | | 327/555 |
| 2015/0229274 A1* | 8/2015 | Cho | H03F 1/083 |
| | | | 330/260 |
| 2015/0311871 A1* | 10/2015 | Ide | H03F 1/3211 |
| | | | 398/212 |

* cited by examiner

RECEIVER CIRCUIT

CROSS-REFERENCE TO RELATED APPLICATIONS

This application is based upon and claims the benefit of priority of the prior Japanese Patent Application No. 2014-092755, filed on Apr. 28, 2014, the entire contents of which are incorporated herein by reference.

FIELD

The embodiments discussed herein are related to a receiver circuit.

BACKGROUND

Recently, in high-end servers, super computers, or the like, an optical interconnect that uses a high-speed optical transmission technique is being considered for short-range and medium-range signal transmissions between CPUs (Central Processing Units), in order to cope with the limits of electrical signal transmission caused by increasing signal transmission rate and increasing signal transmission capacity between the CPUs. According to the optical interconnect, an optical transceiver for converting electrical signals into optical signals, or the like, is provided to transmit data by optical signals between optical transmission apparatuses at a transmitter end and a receiver end, through transmission channels such as array optical fibers or the like, for example. A laser device called VCSEL (Vertical Cavity Surface Emitting Laser), that is small in size, has a low power consumption, and is cable of directly modulating current, for example, may be used for an optical transmitter for the optical transmission. A PD (Photo-Diode), that receives the optical signal and converts the received optical signal into the electrical signal, for example, may be used for an optical receiver for the optical transmission. A high-speed optical transmission having a signal transmission rate of 25 Gb/s, for example, is required in order to cope with broadband signal transmissions between the CPUs.

Examples of conventional receiver circuits for high-speed optical transmission may include optical receiver circuits having a limiting amplifier and a DC (Direct Current) feedback circuit, as proposed in Japanese Laid-Open Patent Publication No. 2011-109721 and Japanese Laid-Open Patent Publication No. 2012-010187, for example. The DC feedback circuit reduces an offset voltage between differential output signals differentially amplified by the limiting amplifier. The proposed optical receiver circuits may have properties such as a simple configuration, a high operation speed, and a high sensitivity.

However, the offset voltage between the differential output signals may also be affected by an amplification (or gain) of the DC feedback circuit and a magnitude of an input signal. For this reason, the offset voltage between the differential output signals is not sufficiently reduced in the conventional receiver circuits, and DCD (Duty Cycle Distortion) may be generated in the differential output signal. In a case in which a pulse width of the differential output signal deviates from a regular (or correct) value due to the generation of the DCD, there is a possibility that the differential output signal will not be correctly received at the receiver end of the differential output signal, for example.

SUMMARY

Accordingly, it is an object in one aspect of the embodiments to provide a receiver circuit capable reducing DCD in a differential output signal that is obtained by differential amplification of a limiting operation.

According to one aspect of the embodiments, a receiver circuit includes a first amplifier circuit configured to differentially amplify differential input signals by a linear operation; a second amplifier circuit configured to differentially amplify differential signals output from differential output nodes of the first amplifier circuit by a limiting operation; a first resistor having one end coupled to a first positive-phase output node of the differential output nodes of the first amplifier circuit; a second resistor having one end thereof coupled to a first negative-phase output node of the differential output nodes of the first amplifier circuit, and having a resistance value identical to that of the first resistor; a third resistor having one end thereof coupled to a second positive-phase output node of differential output nodes of the second amplifier circuit; a fourth resistor having one end thereof coupled to a second negative-phase output node of the differential output nodes of the second amplifier circuit, and having a resistance value identical to that of the third resistor; and a feedback circuit configured to amplify a positive-phase signal that is output from a positive-phase output node thereof coupled to another end of the first resistor and another end of the third resistor, and a negative-phase signal that is output from a negative-phase output node thereof coupled to another end of the second resistor and another end of the fourth resistor, and to feedback a feedback signal after amplification to the first amplifier circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be described with reference to the accompanying drawings.

A description will now be given of the receiver circuit in each embodiment according to the present invention.

Figure 1:
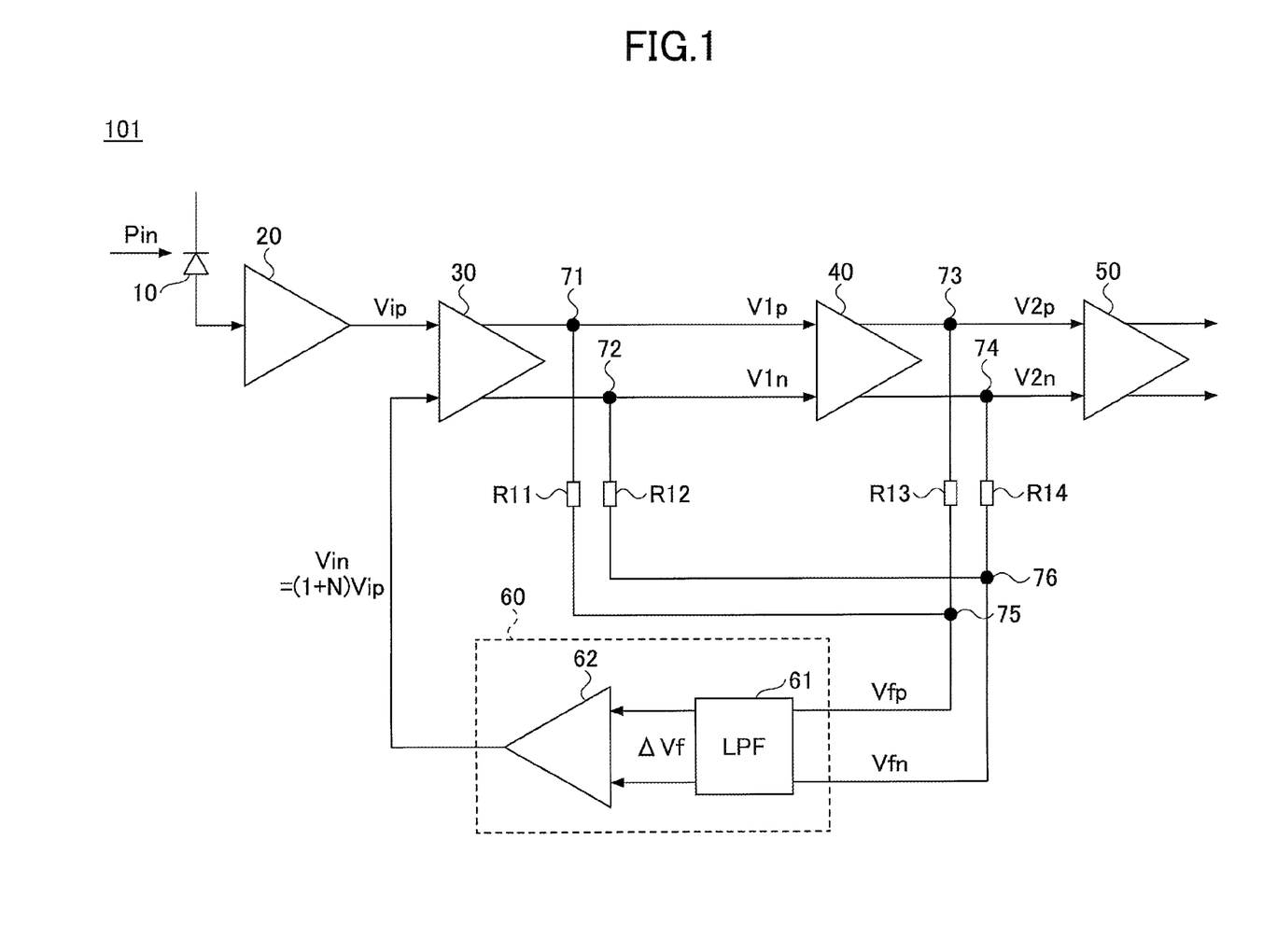
FIG. 1 is a diagram illustrating a configuration of an example of a receiver circuit.

FIG. 1 is a diagram illustrating a configuration of an example of a receiver circuit 101 in one embodiment. The receiver circuit 101 is an example of an optical receiver circuit that is used at a receiver end of an optical transmission such as the optical interconnect or the like, for example. By using the receiver circuit 101 for optical communication, a signal transmission rate between a transmitter end and the receiver end can be improved to 25 Gbps or higher, for example, and a broadband communication and a high-sensitivity communication can be performed using a relatively simple configuration.

The receiver circuit 101 includes a photodiode 10, an TIA (Trans Impedance Amplifier) 20, a first amplifier 30, a second amplifier 40, an output buffer 50, resistors R11 through R14, and a DC feedback circuit 60, for example.

The TIA 20 may be arranged in the same integrated circuit chip as the first amplifier 30 and the circuits subsequent the first amplifier 30, or may be arranged in an integrated circuit chip different from that including the first amplifier 30 and the circuits subsequent to the first amplifier 30.

The photodiode 10 is an example of a light receiving element that receives an optical signal Pin, and converts the optical signal Pin into a current signal. The TIA 20 is an example of a trans impedance amplifier that converts the current signal into a voltage signal, and converts the current signal output from the photodiode 10 into a positive-phase input signal Vip. The positive-phase input signal Vip is a single-end voltage signal.

Figure 2:
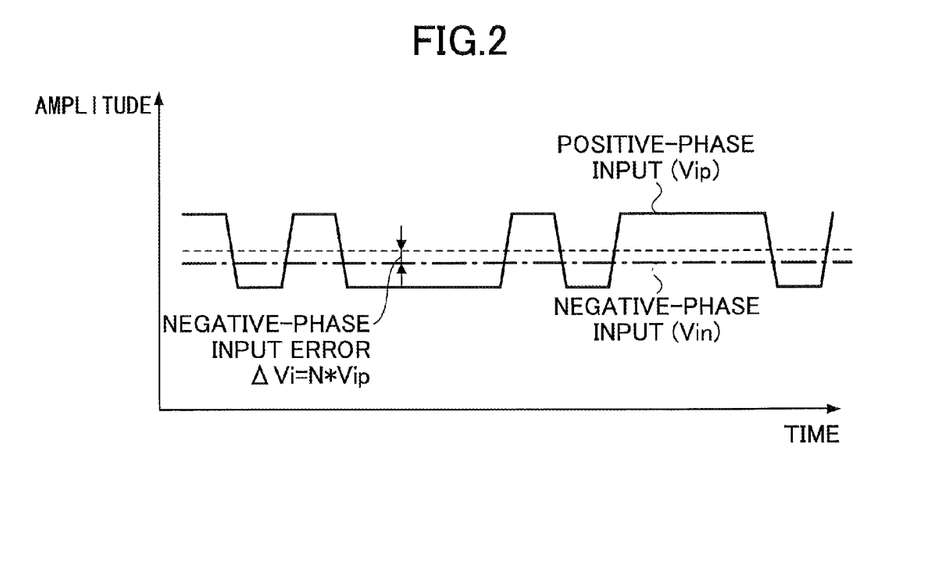
FIG. 2 is a diagram illustrating signal waveforms of an example of differential input signals.

The first amplifier 30 is an example of a first amplifier circuit that differentially amplifies and outputs differential input signals by a linear operation. For example, the first amplifier 30 is a differential amplifier that differentially amplifies and outputs, by the linear operation, the positive-phase input signal Vip input from the TIA 30 and a negative-phase (or reverse-phase) input signal Vin input from the DC feedback circuit 60. FIG. 2 is a diagram illustrating signal waveforms of an example of differential input signals, namely, the positive-phase input signal Vip and the negative-phase input signal Vin. In FIG. 1, the first amplifier 30 performs a linear operation to linearly and differentially amplify the pair of positive-phase input signal Vip and negative-phase input signal Vin within a predetermined amplification range, and output a linearly and differentially amplified pair of differential signals (that is, positive-phase signal Vip and negative-phase signal Vin).

Figure 3:
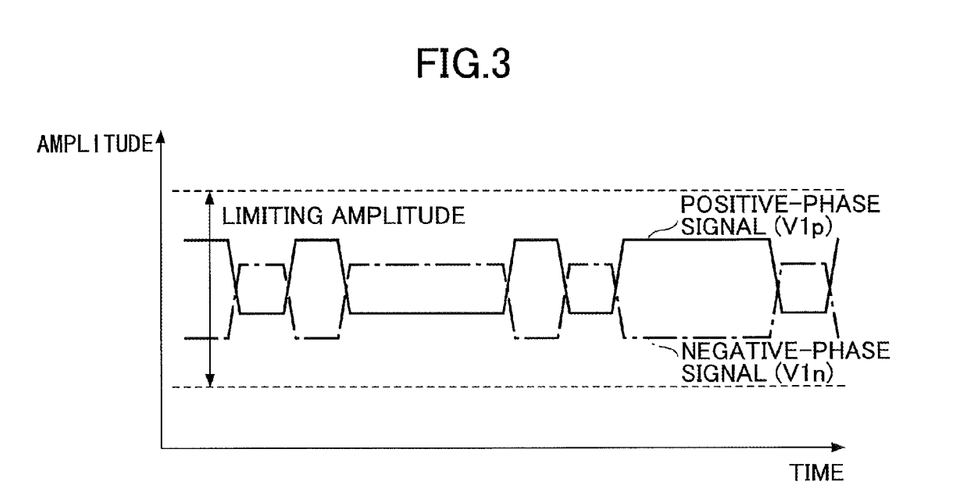
FIG. 3 is a diagram illustrating signal waveforms for explaining an example of a linear operation.

FIG. 3 is a diagram illustrating signal waveforms for explaining an example of the linear operation. The first amplifier 30 performs the linear operation to vary DC components of the positive-phase signal Vip and the negative-phase signal Vin, so that amplitudes of the positive-phase signal Vip and the negative-phase signal Vin do not exceed a predetermined amplitude level (or limiting amplitude). In a case in which a difference exists between voltage levels of the positive-phase input signal Vip and the negative-phase input signal Vin, this difference is linearly amplified, and appears as an output voltage level difference of the positive-phase signal Vip and the negative-phase signal Vin.

In FIG. 1, the second amplifier is an example of a second amplifier circuit that differentially amplifies and outputs differential signals output from differential output nodes of the first amplifier 30 by a limiting operation. For example, the second amplifier 40 is a differential limiting amplifier that differentially amplifies and outputs, by the limiting operation, the positive-phase signal Vip output from a positive-phase output node 71 of the first amplifier 30 and the negative-phase signal V1n output from a negative-phase output node 72 of the first amplifier 30. In the case illustrated in FIG. 1, the second amplifier 40 performs the limiting operation (hereinafter also referred to as a "saturation operation") to differentially amplify the pair of positive-phase signal V1p and negative-phase signal V1n, and output a pair of differential output signals (that is, positive-phase output signal V2p and negative-phase output signal V2n) limited to the predetermined amplitude level. The second amplifier 40 includes a positive-phase output node 73 to output the positive-phase output signal V2p, and a negative-phase output node 74 to output the negative-phase output signal V2n.

Figure 4:
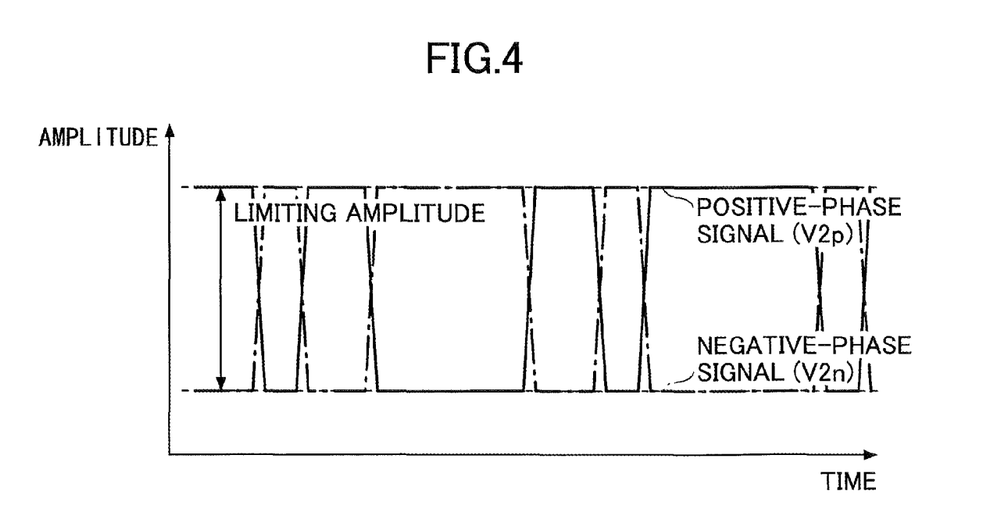
FIG. 4 is a diagram illustrating signal waveforms for explaining an example of a limiting operation.

FIG. 4 is a diagram illustrating signal waveforms for explaining an example of the limiting operation. The second amplifier 40 outputs the differential signals in a state in which the amplitudes of the positive-phase output signal V2p and the negative-phase output signal V2n are limited to the limiting amplitude. In a case in which a difference exists between the voltage levels of the positive-phase signal V1p and the negative-phase signal V1n, output amplitude levels of the positive-phase output signal V2p and the negative-phase output signal V2n are limited to a constant level by the limiting operation, and this difference appears as a variation in pulse widths of the positive-phase output signal V2p and the negative-phase output signal V2n.

In FIG. 1, the output buffer 50 is an example of a circuit that shapes the differential output signals output from the differential output nodes 73 and 74 of the second amplifier 40. For example, the output buffer 50 shapes and differentially amplifies the positive-phase output signal V2p and the negative-phase output signal V2n. Differential output signals output from the output buffer 50 become substantially the same as the positive-phase output signal V2p and the negative-phase output signal V2n, and the output buffer 50 may be omitted.

The resistor R11 is an example of a first resistor that has one end thereof connected to the positive-phase output node 71 of the first amplifier 30. The resistor R12 is an example of a second resistor that has one end thereof connected to the negative-phase output node 72 of the first amplifier 30, and has the same resistance value as the resistor R11. The resistors R12 and R12 form a resistor pair that is connected to the differential output nodes 71 and 72 of the first amplifier 30.

The resistor R13 is an example of a third resistor that has one end thereof connected to the positive-phase output node 73 of the second amplifier 40. The resistor R14 is an example of a fourth resistor that has one end thereof connected to the negative-phase output node 74 of the second amplifier 40, and has the same resistance value as the resistor R13. The resistors R13 and R14 form a resistor pair that is connected to the differential output nodes 73 and 74 of the second amplifier 40.

The DC feedback circuit 60 is an example of a feedback circuit that amplifies a positive-phase feedback signal Vfp output from a node 75 and a negative-phase feedback signal Vfn output from a node 76, and feeds back a feedback signal (in the case illustrated in FIG. 1, the negative-phase input signal Vin) after the amplification to the first amplifier 30. The node 75 is an example of a positive-phase output node that is connected to the other end of the resistor R11 and the other end of the resistor R13. The node 76 is an example of a negative-phase output node that is connected to the other end of the resistor R12 and the other end of the resistor R14. The negative-phase input signal Vin is a single-end voltage signal.

The DC feedback circuit 60 can reduce an offset voltage $\Delta V2$ between the positive-phase output signal V2p and the negative-phase output signal V2n, by feeding back the negative-phase input signal Vin to the first amplifier 30. The offset voltage $\Delta V2$ is an error (or offset) between an average voltage of the positive-phase output signal V2p and an average voltage of the negative-phase output signal V2n. The average voltage is also referred to as the DC component.

The DC feedback circuit 60 generates the negative-phase input signal Vin that is input to a negative-phase input node of the first amplifier 30, based on a difference ΔVf between an average voltage of the positive-phase feedback signal Vfp and an average voltage of the negative-phase feedback signal Vfn, so that the average voltage of the positive-phase output signal V2p matches the average voltage of the negative-phase output signal V2n, for example.

The DC feedback circuit 60 includes a lowpass filter 61 and a differential amplifier circuit 62, for example. The pair of the positive-phase feedback signal Vfp and the negative-phase feedback signal Vfn is input to the lowpass filter 61, and an output of the lowpass filter 61 is input to the differential amplifier circuit 62. The differential amplifier circuit 62 generates the negative-phase input signal Vin by amplifying the differential signals (that is, a difference ΔVf between the average voltage of the positive-phase feedback signal Vfp and the average voltage of the negative-phase feedback signal Vfn) output from the lowpass filter 61.

Figure 5:
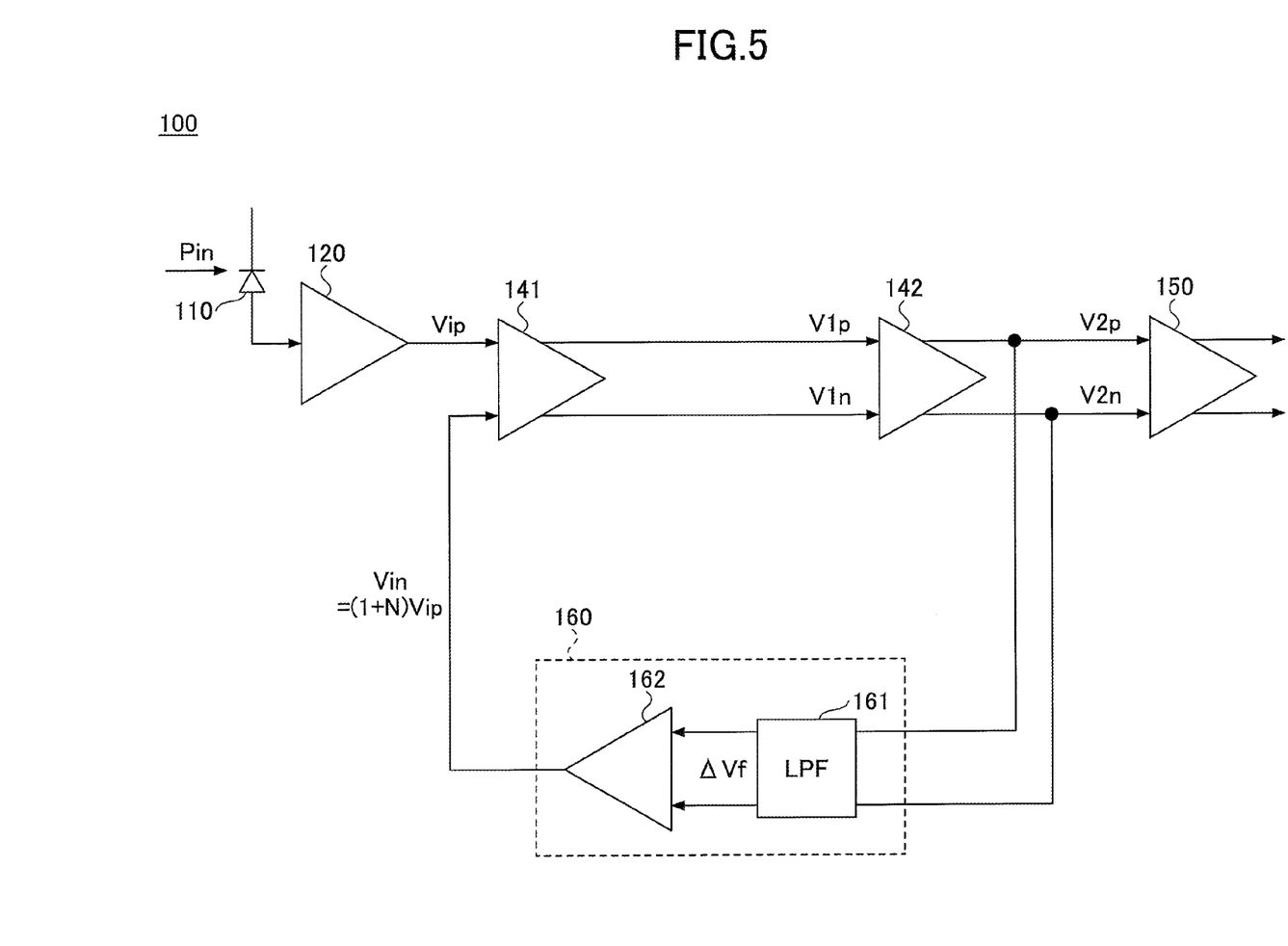
FIG. 5 is a diagram illustrating a configuration of an example of the receiver circuit in a comparison example.

FIG. 5 is a diagram illustrating a configuration of an example of a receiver circuit 100 in a comparison example, to be compared with the receiver circuit 101 or the like of the embodiment. The receiver circuit 100 is described hereinafter for comparison purposes.

The receiver circuit 100 includes a photodiode 110, a TIA 120, amplifiers 141 and 142, an output buffer 150, and a DC feedback circuit 160.

Each of the amplifiers 141 and 142 is an amplifier circuit that differentially amplifies and outputs, by a limiting operation, differential signals that are input thereto. The amplifiers 141 and 142 that are cascaded may be formed by a single amplifier. The DC feedback circuit 160 is a feedback circuit that amplifies the positive-phase output signal V2p and the negative-phase output signal V2n that are output from the amplifier 142, and feeds back a feedback signal (in the case illustrated in FIG. 5, the negative-phase input signal Vin) after the amplification to the amplifier 141.

The DC feedback circuit 160 includes a lowpass filter 161 and a differential amplifier circuit 162, for example. The pair of the positive-phase feedback signal V2p and the negative-phase feedback signal V2n is input to the lowpass filter 161, and an output of the lowpass filter 161 is input to the differential amplifier circuit 162. The differential amplifier circuit 162 generates the negative-phase input signal Vin by amplifying the differential signals (that is, a difference ΔVf between an average voltage of the positive-phase feedback signal V2p and an average voltage of the negative-phase feedback signal V2n) output from the lowpass filter 161.

The negative-phase input signal Vin in FIG. 5 may be represented by the following formula (1), where g2 denotes an amplification of the DC feedback circuit 160 (for example, the gain of the differential amplifier circuit 162), and Vof denotes an offset error of the DC feedback circuit 160.

$$Vin = g2 \cdot (\Delta Vf + Vof) \tag{1}$$

The offset error Vof in the formula (1) represents an offset voltage caused by relative inconsistencies (or variations introduced during manufacture) amongst differential transistors of the differential amplifier circuit 162, for example.

On the other hand, an offset voltage ΔV2 (=V2p−V2n) between the positive-phase output signal V2p and the negative-phase output signal V2n appears as an average value of the DCD of the positive-phase output signal V2p and the negative-phase output signal V2n, because the amplifiers 151 and 142 perform the limiting operation. A magnitude of the offset voltage ΔV2 is not proportional to the magnitude of the positive-phase input signal Vip, but is proportional to a ratio N of ΔVi (=Vip−Vin) with respect to the positive-phase input signal Vip. Hence, the offset voltage ΔV2 between the positive-phase output signal V2p and the negative-phase output signal V2n may be represented by the following formula (2), where k denotes a combined gain of the amplifiers 141 and 142.

$$\Delta V2 = k \cdot (\Delta Vi/Vip) = k \cdot N \tag{2}$$

A stability condition of a feedback system using the DC feedback circuit 160 may be represented by the following formula (3).

$$\Delta V2 = \Delta Vf \tag{3}$$

Thus, this stability condition may be represented by the following formula (4), based on the formulas (1), (2), and (3) described above. The formula (4) is a simplified representation assuming that Vip is approximately equal to Vin (that is, Vip≈Vin) and N<1.

$$\Delta V2 = (Vin/g2) - Vof \approx (Vip/g2) - Vof \tag{4}$$

According to formula (4) above, in a case in which the positive-phase input signal Vip that is input is relatively large, there is a problem in that the offset voltage ΔV2 increases, that is, the DCD of the positive-phase output signal V2p and the negative-phase output signal V2n increases.

On the other hand, the negative-phase input signal Vin in FIG. 1 may be represented by the following formula (5), where g2 denotes the amplification of the DC feedback circuit 60 (that is, the gain of the differential amplifier circuit 62), and Vof denotes the offset error of the DC feedback circuit 60.

$$Vin = g2 \cdot (\Delta Vf + Vof) \tag{5}$$

The offset error Vof in the formula (5) represents an offset voltage caused by relative inconsistencies (or variations introduced during manufacture) amongst differential transistors of the differential amplifier circuit 62, for example.

On the other hand, the offset voltage ΔV1 (=Vip−V1n) between the positive-phase signal Vip and the negative-phase signal V1n is proportional to the magnitude of the positive-phase input signal Vip, because the first amplifier 30 performs the linear operation. The offset voltage ΔV2 (=V2p−V2n) between the positive-phase output signal V2p and the negative-phase output signal V2n appears as an average value of the DCD of the positive-phase output signal V2p and the negative-phase output signal V2n, because the second amplifier 40 performs the limiting operation. The magnitude of the offset voltage ΔV2 is not proportional to the magnitude of the positive-phase input signal Vip, but is proportional to the ratio N of ΔVi (=Vip−Vin) with respect to the positive-phase input signal Vip. Accordingly, the offset voltage ΔV1 between the positive-phase signal Vip and the negative-phase signal Vin, and the offset voltage ΔV2 between the positive-phase output signal V2p and the negative-phase output signal V2n may be represented by the following formulas (6) and (7), respectively, where G denotes the gain of the first amplifier 30, and k denotes the combined gain of the first and second amplifiers 30 and 40.

$$\Delta V1 = G \cdot \Delta Vi = G \cdot N \cdot Vip \quad (6)$$

$$\Delta V2 = k \cdot (\Delta Vi/Vip) = k \cdot N \quad (7)$$

The following formula (8) stands when the resistances of the resistors R11 and R12 are denoted by r1, and the resistances of the resistors R13 and R14 are denoted by r2.

$$(r2/(r1+r2)) \cdot \Delta V1 + (r1/(r1+r2)) \cdot \Delta V2 = \Delta Vf \quad (8)$$

Hence, the stability condition of the feedback system using the DC feedback circuit 60 may be represented by the following formula (9), based on the formulas (5) through (8) described above, where c is a positive number represented by $c = (r1/(r1+r2)) \cdot G \cdot (Vip/k) + (r2/(r1+r2))$. The formula (9) is a simplified representation assuming that Vip is approximately equal to Vin (that is, Vip Vin) and N<1.

$$\Delta V2 = \{(Vip/g2) - Vof\}/c \quad (9)$$

Accordingly, as is evident from a comparison of the formula (4) (the case illustrated in FIG. 5) and the formula (9) (the case illustrated in FIG. 1), the receiver circuit 101 illustrated in FIG. 1 can reduce the offset voltage ΔV2 to 1/c that of the receiver circuit 100 illustrated in FIG. 5, and can reduce the DCD of the positive-phase output signal V2p and the negative-phase output signal V2n. In other words, according to the formula (9), the term Vip is included in the positive number c, and the value of 1/c becomes small under a condition in which the input amplitude of the positive-phase input signal Vip is large. Hence, even in a state in which the positive-phase input signal Vip is input with a relatively large input amplitude, the DCD in this state can be reduced sufficiently. In addition, according to the formula (9), the value of 1/c is directly multiplied to the offset error Vof caused by the relative inconsistencies (or variations introduced during manufacture) amongst the differential transistors of the differential amplifier circuit 62, and for this reason, the DCD caused by the relative inconsistencies amongst the differential transistors can be reduced sufficiently.

Furthermore, the resistance values of the resistors R11 through R14 are less likely to vary compared to the gain of the differential amplifier circuit 62, even when the conditions such as an ambient temperature, fabricating process, or the like vary. According to the formula (9), the offset voltage ΔV2 are adjustable according to a resistance ratio of the resistors R11 through R14. Hence, the reduction of the DCD of the differential signals can easily be adjusted with respect to the variation in the conditions, such as the ambient temperature, process, or the like.

Figure 6:
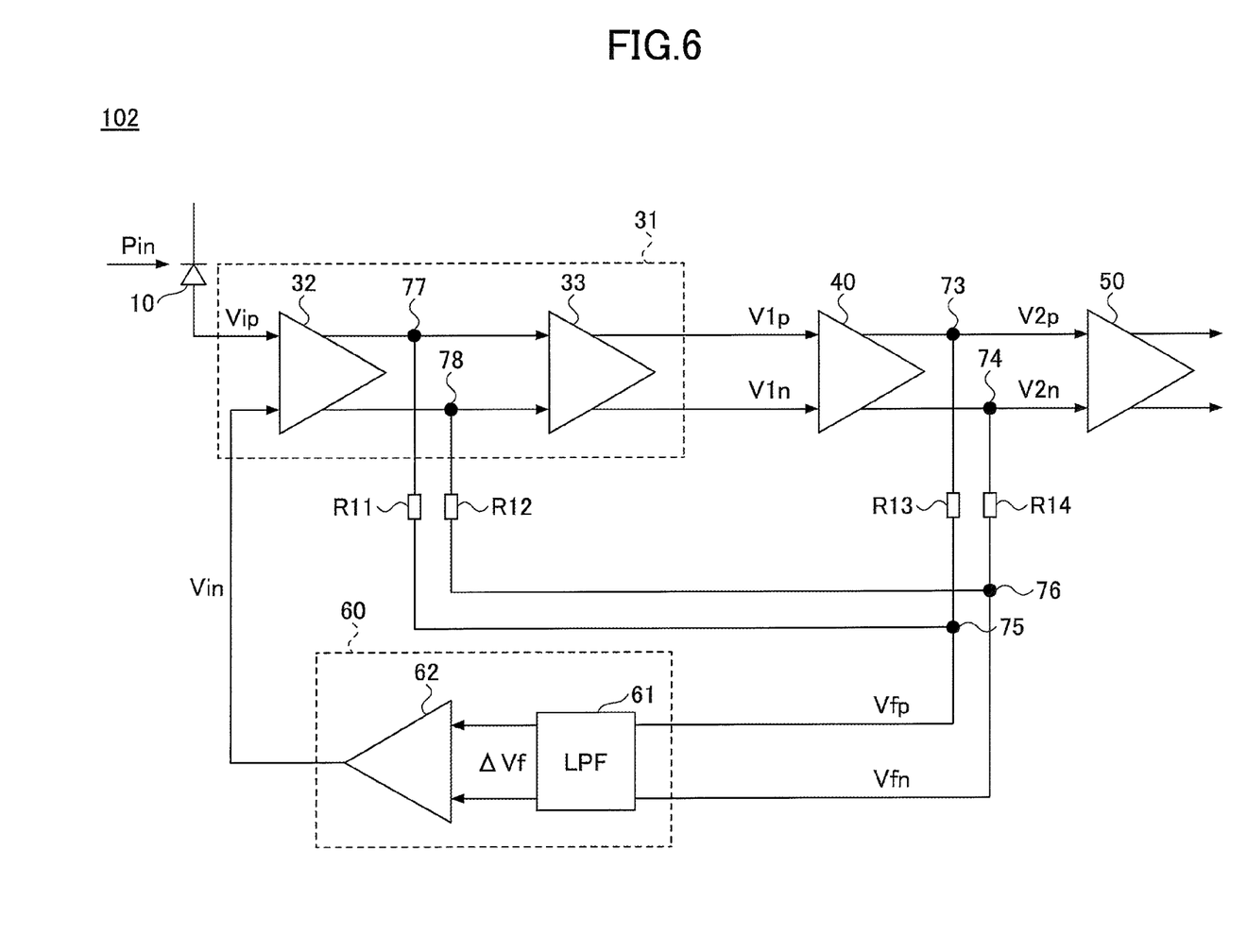
FIG. 6 is a diagram illustrating a configuration of an example of the receiver circuit.

FIG. 6 is a diagram illustrating a configuration of an example of a receiver circuit 102 in one embodiment. In FIG. 6, those parts that are the same as those corresponding parts in FIG. 1 are designated by the same reference numerals, and a description thereof will be omitted. The receiver circuit 102 illustrated in FIG. 6 is an example of an optical receiver circuit including the photodiode 10, a first amplifier 31, the second amplifier 40, the output buffer 50, the resistors R11 through R14, and the DC feedback circuit 60.

The first amplifier 31 is an example of a first amplifier circuit that differentially amplifies the differential signals by a linear operation. The first amplifier 31 is a differential linear amplifier that includes a TIA 32 and a linear amplifier 33, for example.

The TIA 32 is an example of a trans impedance amplifier that differentially amplifies and outputs the differential signals. For example, the TIA 32 differentially amplifies and outputs the positive-phase input signal Vip that is input according to the current signal supplied form the photodiode 10, and the negative-phase input signal Vin that is input from the DC feedback circuit 60.

The linear amplifier 33 is an example of a linear amplifier circuit that differentially amplifies and outputs the differential signals output from the TIA 32 by a linear operation. For example, the linear amplifier 33 performs the linear operation in which the differential signals output from the TIA 32 are linearly and differentially amplified, and a pair of differential signals (that is, the positive-phase signal Vip and the negative-phase signal V1n) after the linear differential amplification is output.

One end of the resistor R11 is connected to a positive-phase output node 77 of the TIA 32, and one end of the resistor R12 is connected to a negative-phase output node 78 of the TIA 32. The resistors R11 and R12 form a resistor pair that is connected to the output nodes 77 and 78 of the TIA 32 in the first amplifier 31.

The DC feedback circuit 60 can reduce the offset voltage ΔV2 between the positive-phase output signal V2p and the negative-phase output signal V2n, by feeding back the negative-phase input signal Vin to the first amplifier 31. The DC feedback circuit 60 generates the negative-phase input signal Vin that is input to a negative-phase input node of the TIA 32, based on a difference ΔVf between an average voltage of the positive-phase feedback signal Vfp and an average voltage of the negative-phase feedback signal Vfn, so that the average voltage of the positive-phase output signal V2p matches the average voltage of the negative-phase output signal V2n, for example.

The receiver circuit 102 can obtain effects similar to those obtainable by the receiver circuit 101, such as reducing the DCD generated in the positive-phase output signal V2p and the negative-phase output signal V2n, or the like.

Figure 7:
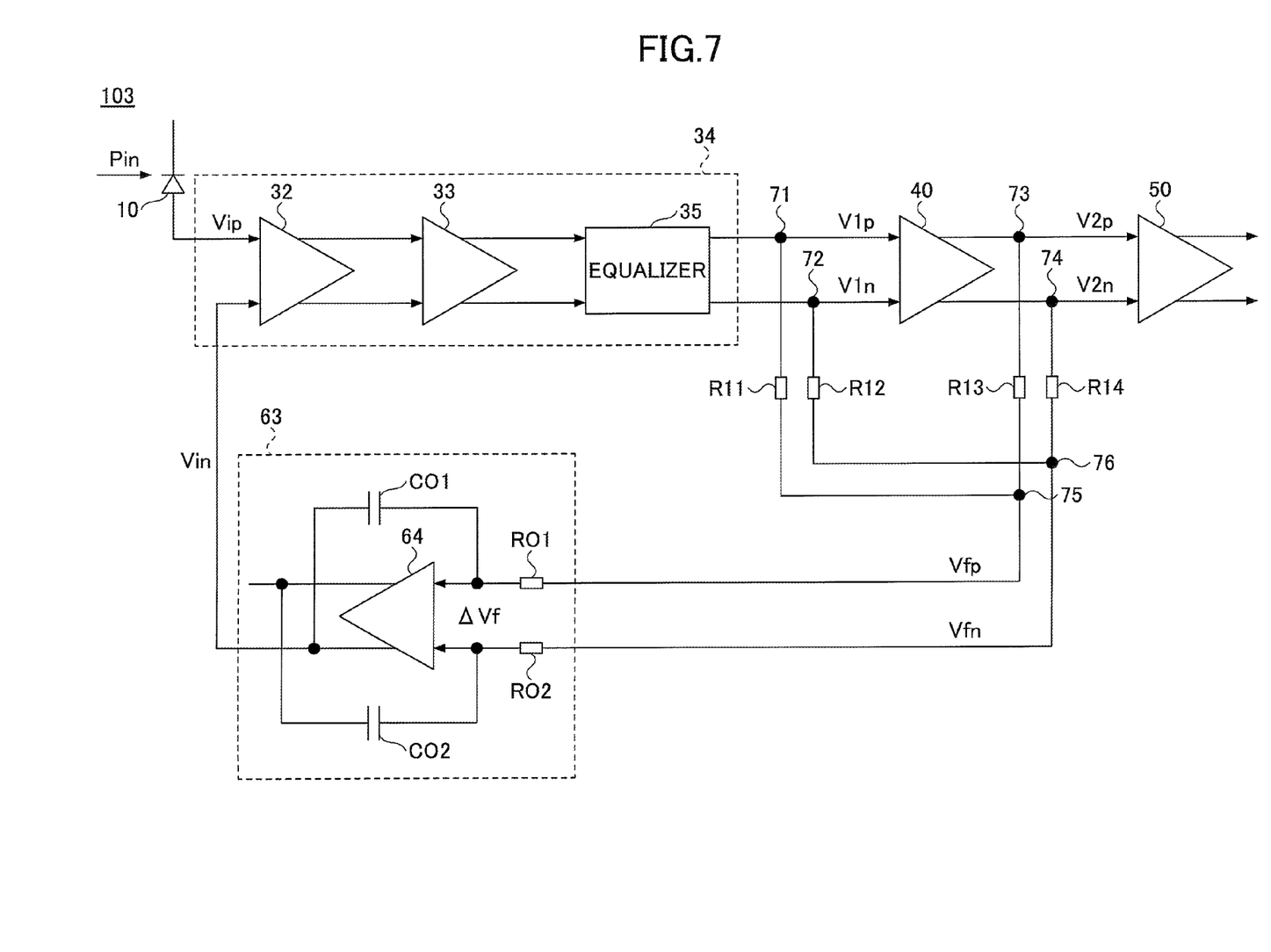
FIG. 7 is a diagram illustrating a configuration of an example of the receiver circuit.

FIG. 7 is a diagram illustrating a configuration of an example of a receiver circuit 103 in one embodiment. In FIG. 7, those parts that are the same as those corresponding parts in FIGS. 1 and 6 are designated by the same reference numerals, and a description thereof will be omitted. The receiver circuit 103 illustrated in FIG. 7 is an example of an optical receiver circuit including the photodiode 10, a first amplifier 34, the second amplifier 40, the output buffer 50, the resistors R11 through R14, and a DC feedback circuit 63.

The first amplifier 34 is an example of a first amplifier circuit that differentially amplifies the differential signals by a linear operation. The first amplifier 34 is a differential linear amplifier that includes the TIA 32, the linear amplifier 33, and an equalizer 35, for example.

The equalizer 35 is an example of an equalizer circuit that amplifies high-frequency differential signals with a gain greater than a gain with which low-frequency differential signals are amplified. The equalizer 35 can compensate for the amplitude of the differential signals, that is insufficient, by amplifying the high-frequency differential signals with the greater gain than the low-frequency differential signals. For example, the equalizer 35 may be cascaded to the TIA 32 at a stage preceding or at a stage subsequent to the TIA 32. Alternatively, the equalizer 35 may be cascaded to the linear amplifier 33 at a stage preceding or at a stage subsequent to the linear amplifier 33. In the case illustrated in FIG. 7, the pair of differential signals output from the linear amplifier 33 is input to the equalizer 35, and the equalizer 35 amplifies the pair of differential signals input within a predetermined high-frequency band with the gain that is greater than the gain with which the pair of differential signals input within a predetermined low-frequency band lower than the predetermined high-frequency band is amplified.

The DC feedback circuit 63 can reduce the offset voltage ΔV2 between the positive-phase output signal V2p and the negative-phase output signal V2n, by feeding back the negative-phase input signal Vin to the first amplifier 34. The DC feedback circuit 63 generates the negative-phase input signal Vin that is input to a negative-phase input node of the TIA 32, based on the difference ΔVf between the average voltage of the positive-phase feedback signal Vfp and the average voltage of the negative-phase feedback signal Vfn, so that the average voltage of the positive-phase output signal V2p matches the average voltage of the negative-phase output signal V2n, for example.

For example, the DC feedback circuit 63 is a differential active lowpass filter circuit that includes a differential amplifier circuit 64 input with the pair of the positive-phase feedback signal Vfp and the negative-phase feedback signal Vfn, resistors RO1 and R02, and capacitors CO1 and CO2. The resistor RO1 is inserted between a positive-phase input terminal of the differential amplifier circuit 64 and the node 75, and the resistor R02 is inserted between a negative-phase input terminal of the differential amplifier circuit 64 and the node 76. The capacitor CO1 has one end thereof connected to a positive-phase output node of the differential amplifier circuit 64, and another end thereof connected to a negative-phase output node of the differential amplifier circuit 64. The capacitor CO2 has one end thereof connected to the negative-phase output node of the differential amplifier circuit 64, and another end thereof connected to the positive-phase output node of the differential amplifier circuit 64. The DC feedback circuit 63 feeds back the negative-phase input signal Vin that is output from the negative-phase output node of the differential amplifier circuit 64 to the negative-phase input node of the TIA 22, for example. Due to a Miller effect of the capacitors CO1 and CO2, a capacitance of the lowpass filter formed by the DC feedback circuit 63 can be made greater than the capacitances of the capacitors CO1 and CO2.

The receiver circuit 103 can obtain effects similar to those obtainable by the receiver circuit 101, such as reducing the DCD generated in the positive-phase output signal V2p and the negative-phase output signal V2n, or the like.

Figure 8:
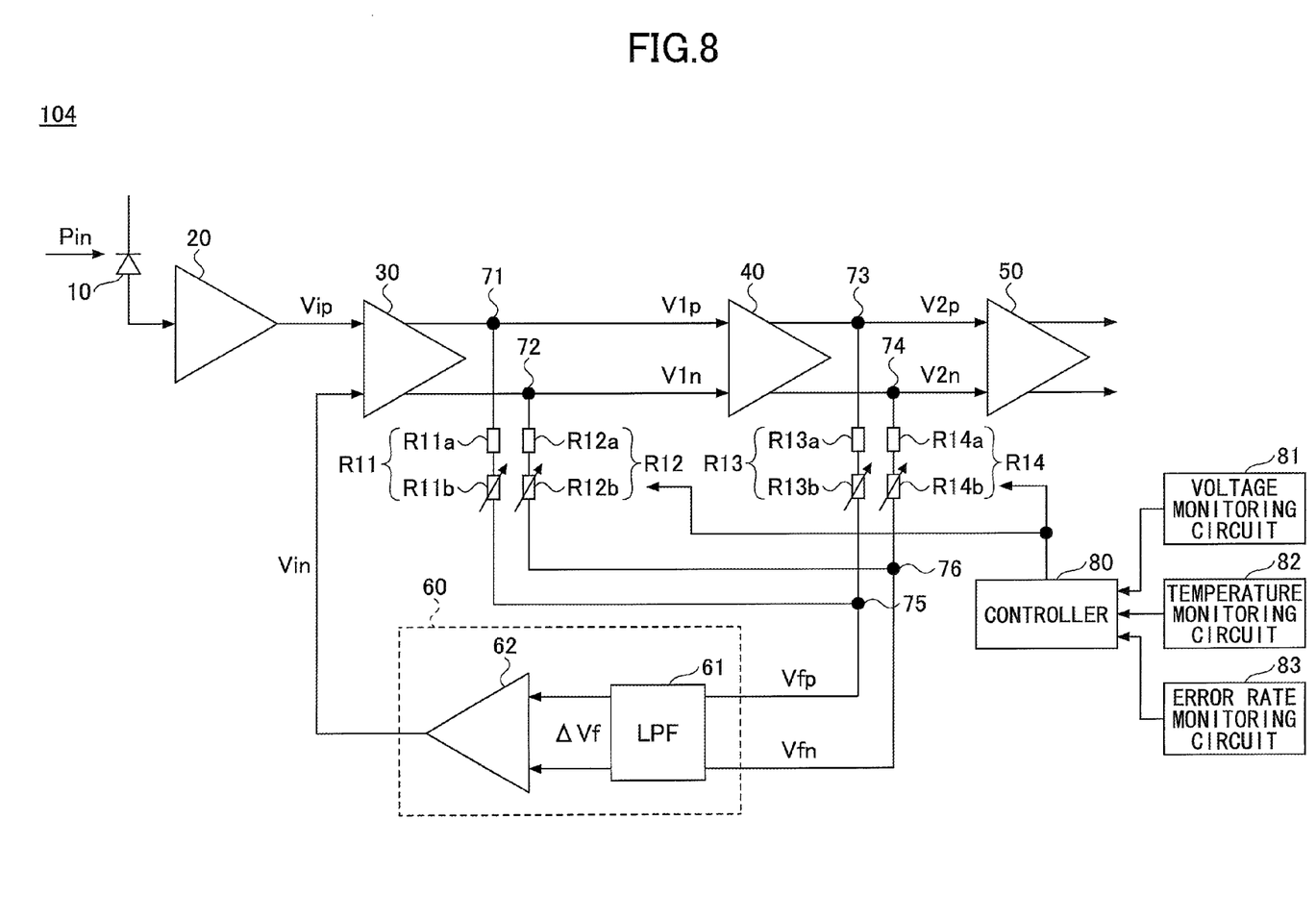
FIG. 8 is a diagram illustrating a configuration of an example of the receiver circuit.

FIG. 8 is a diagram illustrating a configuration of an example of a receiver circuit 104 in one embodiment. In FIG. 8, those parts that are the same as those corresponding parts in FIGS. 1 and 6 are designated by the same reference numerals, and a description thereof will be omitted. The receiver circuit 104 illustrated in FIG. 8 is an example of an optical receiver circuit including the photodiode 10, the TIA 20, the first amplifier 30, the second amplifier 40, the output buffer 50, the resistors R11 through R14, the DC feedback circuit 60, and a controller 80.

At least one of the resistors R11 through R14 may be a variable resistor having a resistance value that is variable. When at least one of the resistors R11 through R14 is the variable resistor, the negative-phase input signal Vin, that is the feedback signal, can easily be adjusted, and for this reason, the offset voltage ΔV2 can easily be adjusted. Hence, an amount of DCD to be reduced can easily be adjusted. FIG. 8 illustrates an example in which all of the resistors R11 through R14 are variable resistors.

For example, the resistor R11 is a variable resistor having a configuration in which a resistor element R11a having a fixed resistance, and a resistor element R11b having a variable resistance are connected in series. The other resistors R12, R13, and R14 may have configurations similar to that of the resistor R11.

For example, the receiver circuit 104 may include the controller 80 that controls the resistance of at least one of the resistors R11 through R14. For example, the controller 80 may control the resistance of at least one of the resistors R11 through R14, based on the differential output signals formed by the positive-phase output signal V2p and the negative-phase output signal V2n, so that the offset voltage ΔV2 between the positive-phase output signal V2p and the negative-phase output signal V2n decreases. Hence, the controller 80 can reduce only the DCD generated in the differential output signals, and a combined resistance value of the resistors R11 through R14 can be controlled to an optimum value suited for the receiver of the differential output signals.

The receiver circuit 104 may include a voltage monitoring circuit 81, for example. The voltage monitoring circuit 81 is an example of a circuit that detects at least one of the positive-phase output signal V2p and the negative-phase output signal V2n. The controller 80 may control the resistance value of at least one of the resistors R11 through R14 according to a voltage detected by the voltage monitoring circuit 81, so that the offset voltage ΔV2 between the positive-phase output signal V2p and the negative-phase output signal V2n decreases. Accordingly, even when at least one of the positive-phase output signal V2p and the negative-phase output signal V2n varies, the DCD generated in the differential output signals can be reduced, and the combined resistance value of the resistors R11 through R14 can be controlled to an optimum value suited for the receiver of the differential output signals.

The receiver circuit 104 may include a temperature monitoring circuit 82, for example. The temperature monitoring circuit 82 is an example of a circuit that detects a temperature. The controller 80 may control the resistance value of at least one of the resistors R11 through R14 according to the temperature detected by the temperature monitoring circuit 82, so that the offset voltage ΔV2 between the positive-phase output signal V2p and the negative-phase output signal V2n decreases. Accordingly, even when the temperature of the receiver circuit 104 varies, the DCD generated in the differential output signals can be reduced, and the combined resistance value of the resistors R11 through R14 can be controlled to an optimum value suited for the receiver of the differential output signals.

The receiver circuit 104 may include an error rate monitoring circuit 83, for example. The error rate monitoring circuit 83 is an example of a circuit that detects an error rate of the differential output signals formed by the positive-phase output signal V2p and the negative-phase output signal V2n (for example, a BER (Bit Error Rate) of received data obtained from the differential output signals). The controller 80 may control the resistance value of at least one of the resistors R11 through R14 according to the error rate detected by the error rate monitoring circuit 83, so that the offset voltage ΔV2 between the positive-phase output signal V2p and the negative-phase output signal V2n decreases. Accordingly, even when the error rate of the differential output signals varies, the DCD generated in the differential output signals can be reduced, and the combined resistance value of the resistors R11 through R14 can be controlled to an optimum value suited for the receiver of the differential output signals.

The receiver circuit 104 can obtain effects similar to those obtainable by the receiver circuit 101, such as reducing the DCD generated in the positive-phase output signal V2p and the negative-phase output signal V2n, or the like.

Figure 9:
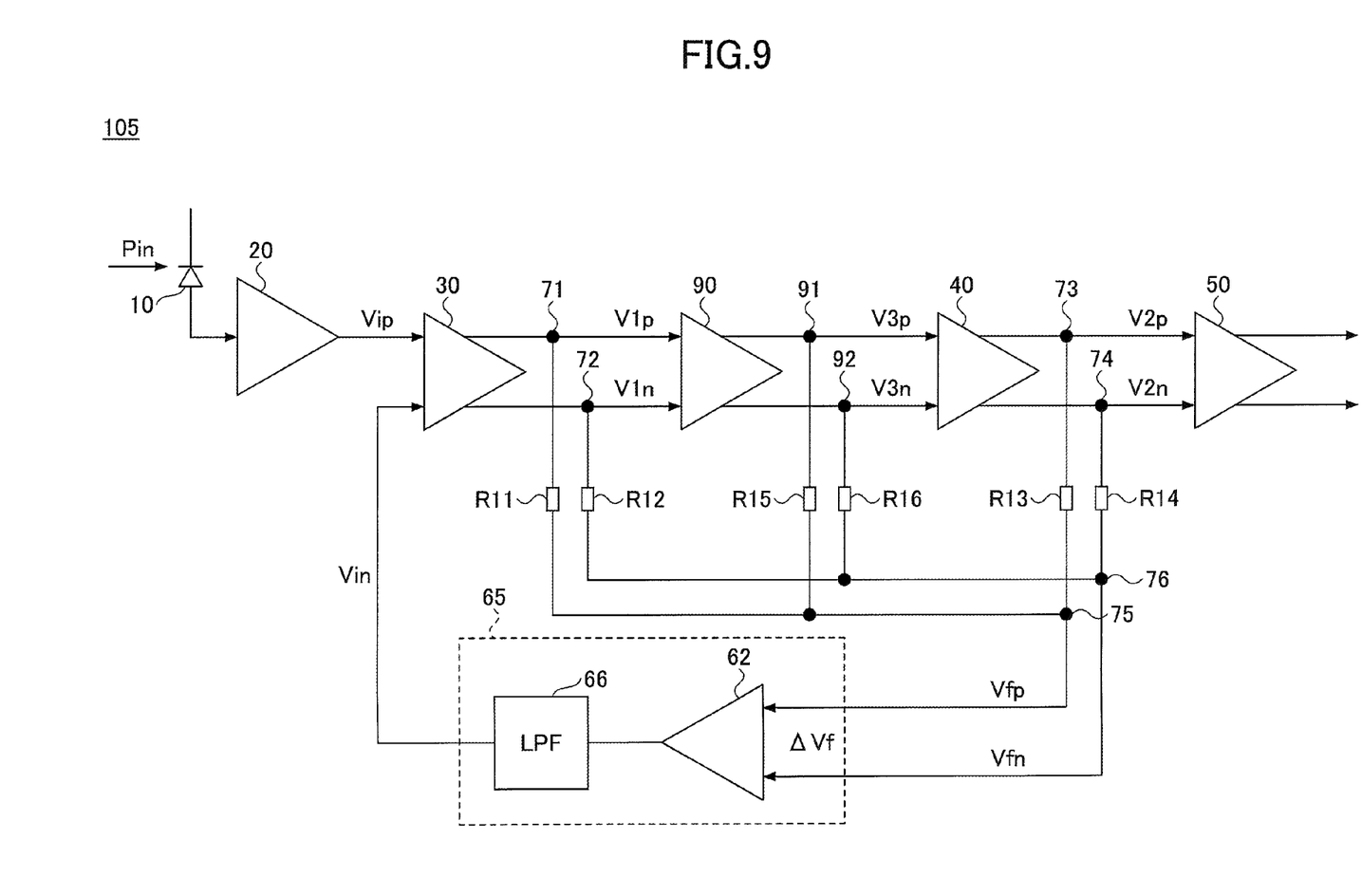
FIG. 9 is a diagram illustrating a configuration of an example of the receiver circuit.

FIG. 9 is a diagram illustrating a configuration of an example of a receiver circuit 105 in one embodiment. In FIG. 9, those parts that are the same as those corresponding parts in FIG. 1 are designated by the same reference numerals, and a description thereof will be omitted. The receiver circuit 105 illustrated in FIG. 9 is an example of an optical receiver circuit including the photodiode 10, the TIA 20, the first amplifier 30, the second amplifier 40, a third amplifier 90, the output buffer 50, resistors R11 through R16, and a DC feedback circuit 65.

The receiver circuit 105 includes the third amplifier 90 cascaded between the first amplifier 30 and the second amplifier 40. The third amplifier 90 is an example of a third amplifier circuit that differentially amplifies and outputs differential input signals. The third amplifier 90 may perform any one of a linear amplification, a limiting amplification, and an intermediate amplification between the linear and limiting amplifications (that is, a linear amplification up to an intermediate input amplitude). By providing at least one such third amplifier 90, the offset voltage ΔV2 can be finely controlled according to the input amplitude. The differential signals output from the first amplifier 30 are input to the third amplifier 90, and differential signals output from the third amplifier 90 are input to the second amplifier 40.

The resistor R15 is an example of a fifth resistor that has one end thereof connected to a positive-phase output node 91 of the third amplifier 90, and another end thereof connected to the node 75. The resistor R16 is an example of a sixth resistor having one end thereof connected to a negative-phase output node 92 of the third amplifier 90, and another end thereof connected to the node 76. The resistors R15 and R16 form a resistor pair that is connected to the differential output nodes 91 and 92 of the third amplifier 90.

The positive-phase feedback signal Vfp and the negative-phase feedback signal Vfn may be generated using also the differential output signals output from the third amplifier 90. By additionally providing the third amplifier 90 and the resistors R15 and R16, it becomes easier to adjust the feedback signal, namely, the negative-phase input signal Vin. As a result, it becomes even easier to adjust the offset voltage ΔV2, and it becomes even more easier to adjust the amount of DCD to be reduced.

The DC feedback circuit 65 can reduce the offset voltage ΔV2 between the positive-phase output signal V2p and the negative-phase output signal V2n, by feeding back the negative-phase input signal Vin to the first amplifier 30. The DC feedback circuit 65 generates the negative-phase input signal Vin that is input to the negative-phase input node of the first amplifier 30, based on the difference ΔVf between the average voltage of the positive-phase feedback signal Vfp and the average voltage of the negative-phase feedback signal Vfn, so that the average voltage of the positive-phase output signal V2p matches the average voltage of the negative-phase output signal V2n, for example.

The DC feedback circuit 65 includes a differential amplifier circuit 62, and a lowpass filter 66 that is input with an output of the differential amplifier circuit, for example. In other words, in a DC feedback circuit, a lowpass filter may be connected at a stage subsequent to a differential amplifier circuit.

The receiver circuit 105 can obtain effects similar to those obtainable by the receiver circuit 101, such as reducing the DCD generated in the positive-phase output signal V2p and the negative-phase output signal V2n, or the like.

The receiver circuit 105 can obtain effects similar to those obtainable by the receiver circuit 101, such as reducing the DCD generated in the positive-phase output signal V2p and the negative-phase output signal V2n, or the like.

According to each of the embodiments described above, it is possible to provide a receiver circuit capable of reducing DCD in a differential output signal that is obtained by differential amplification of a limiting operation.

The disclosed receiver circuit is not limited to the embodiments described above, and various variations and modifications may be made by combining or substituting at least a part of the embodiments.

For example, the third amplifier 90 of the receiver circuit 105 may be applied to any of the other receiver circuits, including the receiver circuit 101.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A receiver circuit comprising:
a first amplifier circuit configured to differentially amplify differential input signals by a linear operation;
a second amplifier circuit configured to differentially amplify differential signals output from differential output nodes of the first amplifier circuit by a limiting operation;
a first resistor having one end coupled to a first positive-phase output node of the differential output nodes of the first amplifier circuit;
a second resistor having one end thereof coupled to a first negative-phase output node of the differential output nodes of the first amplifier circuit, and having a resistance value identical to that of the first resistor;
a third resistor having one end thereof coupled to a second positive-phase output node of differential output nodes of the second amplifier circuit;
a fourth resistor having one end thereof coupled to a second negative-phase output node of the differential output nodes of the second amplifier circuit, and having a resistance value identical to that of the third resistor; and
a feedback circuit configured to amplify a positive-phase signal that is output from a positive-phase output node thereof coupled to another end of the first resistor and another end of the third resistor, and a negative-phase signal that is output from a negative-phase output node thereof coupled to another end of the second resistor and another end of the fourth resistor, and to feedback a feedback signal after amplification to the first amplifier circuit.

2. The receiver circuit as claimed in claim 1, wherein the feedback circuit generates the feedback signal based on a difference between the positive-phase signal and the negative-phase signal, so that a positive-phase output signal from the second amplifier circuit matches a negative-phase output signal from the second amplifier circuit.

3. The receiver circuit as claimed in claim 1, wherein the first amplifier circuit includes a trans impedance amplifier configured to differentially amplify and output differential signals, and a linear amplifier circuit configured to differentially amplify and output differential signals output from the trans impedance amplifier by a linear operation.

4. The receiver circuit as claimed in claim 3, wherein the one end of the first resistor is coupled to a positive-phase output node of the trans impedance amplifier, and the one end of the second resistor is coupled to a negative-phase output node of the trans impedance amplifier.

5. The receiver circuit as claimed in claim 3, wherein the feedback circuit feeds back the feedback signal to the trans impedance amplifier.

6. The receiver circuit as claimed in claim 1, wherein at least one of the first, second, third, and fourth resistors is a variable resistor having a resistance that is variable.

7. The receiver circuit as claimed in claim 6, further comprising:
a controller configured to control the resistance of the variable resistor.

8. The receiver circuit as claimed in claim 7, wherein the controller controls the resistance of the variable resistor, based on differential output signals output from the second amplifier circuit.

9. The receiver circuit as claimed in claim 8, wherein the controller controls the resistance of the variable resistor, according to an error rate or a voltage of the differential output signals.

10. The receiver circuit as claimed in claim 7, wherein the controller controls the resistance of the variable resistor, according to a temperature of the receiver circuit.

11. The receiver circuit as claimed in claim 1, further comprising:
at least one third amplifier circuit configured to differentially amplify and output differential input signals, coupled between the first amplifier circuit and the second amplifier circuit.

12. The receiver circuit as claimed in claim 11, further comprising:
a fifth resistor having one end thereof coupled to a third positive-phase output node of the third amplifier circuit, and another end thereof coupled to the positive-phase output node of the feedback circuit; and
a sixth resistor having one end thereof coupled to a third negative-phase output node of the third amplifier circuit, and another end thereof coupled to the negative-phase output node of the feedback circuit.

13. The receiver circuit as claimed in claim 1, further comprising:
a light receiving element configured to supply the differential input signals to the first amplifier circuit.

14. The receiver circuit as claimed in claim 1, wherein the first amplifier circuit includes an equalizer circuit configured to amplify high-frequency differential signals with a gain greater than a gain with which low-frequency differential signals are amplified.

* * * * *